United States Patent
Li

(10) Patent No.: US 10,371,995 B2
(45) Date of Patent: Aug. 6, 2019

(54) COUPLING CONDUCTIVE TERMINAL STRUCTURE AND DISPLAY DEVICE

(71) Applicant: Wuhan China Star Optoelectronics Semiconductor Display Technology Co., Ltd., Wuhan, Hubei (CN)

(72) Inventor: Cheng Li, Hubei (CN)

(73) Assignee: WUHAN CHINA STAR OPTOELECTONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/743,377

(22) PCT Filed: Nov. 3, 2017

(86) PCT No.: PCT/CN2017/109300
§ 371 (c)(1),
(2) Date: Jan. 10, 2018

(87) PCT Pub. No.: WO2019/075791
PCT Pub. Date: Apr. 25, 2019

(65) Prior Publication Data
US 2019/0121190 A1   Apr. 25, 2019

(30) Foreign Application Priority Data

Oct. 19, 2017  (CN) .......................... 2017 1 0977727

(51) Int. Cl.
*H01R 12/59* (2011.01)
*G02F 1/1345* (2006.01)
*H01R 4/04* (2006.01)
*H01R 12/70* (2011.01)
*H01R 13/03* (2006.01)
*H01R 12/77* (2011.01)

(52) U.S. Cl.
CPC .......... *G02F 1/13452* (2013.01); *H01R 4/04* (2013.01); *H01R 12/7076* (2013.01); *H01R 12/771* (2013.01); *H01R 13/03* (2013.01)

(58) Field of Classification Search
CPC ................................ H01R 4/04; H01L 23/48
USPC .......................... 439/67, 284, 285, 290, 295
See application file for complete search history.

(56) References Cited

U.S. PATENT DOCUMENTS 5,299,939 A * 4/1994 Walker .................... H01R 13/33
                                                          439/284
5,903,059 A * 5/1999 Bertin ................. H01L 21/4853
                                                          257/686

(Continued)

*Primary Examiner* — Abdullah A Riyami
*Assistant Examiner* — Nader J Alhawamdeh
(74) *Attorney, Agent, or Firm* — Hauptman Ham, LLP

(57) ABSTRACT

A coupling conductive terminal structure is provided. The coupling conductive terminal structure is disposed between a display device and an IC or an FPC, and includes a first linking part and a second linking part matched with the first linking part. The first linking part is disposed on the display device, the second linking part is disposed on the IC or the FPC, the first linking part and the second linking part are locked with each other, and the display device electrically connects to the IC or the FPC. The disclosure further provides a display device. By practice of the disclosure, the bonding shift could be overcome to solve the problem of short circuit or poor contact, so the product yield could be improved.

12 Claims, 1 Drawing Sheet

(56) References Cited

U.S. PATENT DOCUMENTS

| | | | | |
|---|---|---|---|---|
| 5,938,455 A | * | 8/1999 | Glovatsky | H01R 12/58 |
| | | | | 439/290 |
| 8,251,758 B2 | * | 8/2012 | Yoshida | H01R 13/28 |
| | | | | 439/290 |
| 2004/0184703 A1 | * | 9/2004 | Bakir | G02B 6/12002 |
| | | | | 385/14 |

* cited by examiner

COUPLING CONDUCTIVE TERMINAL STRUCTURE AND DISPLAY DEVICE

RELATED APPLICATIONS

The present application is a National Phase of International Application Number PCT/CN2017/109300, filed Nov. 3, 2017, and claims the priority of China Application No. 201710977727.9, filed Oct. 19, 2017.

FIELD OF THE DISCLOSURE

The disclosure relates to a liquid crystal display technical field, and more particularly to a coupling conductive terminal structure and a display device.

BACKGROUND

With the development of the flat display panel industry, the requirements of the resolution are getting higher. A display device with a high PPI (pixels per inch, pixel number in per inch) has become a standard equipment of a digital electronic product.

The conventional method of manufacturing a high PPI display device includes the following steps: manufacturing a TFT substrate; manufacturing an emission layer (forming liquid crystal cells or depositing OLED, etc.); bonding (connecting an electric module to a display device); and assembling a product. However, as the resolution is increased, the bonding terminals of the electric module such as IC (integrated circuit), FPC (flexible printed circuit) are increased. For example, the resolution of the mainstream display device is 1920×1080, the TFT substrate need to have 1080 bonding terminals to connect the IC/FPC, so more bonding terminals in the same area need to be manufactured. Therefore, the area of the bonding terminal, the distance between the bonding terminals will be decreased. Currently, the electrical connection between the display device and the IC/FPC is applied ACF (anisotropic conductive film) under the condition of high temperature and high pressure.

However, with the development of flexible and high-resolution panels, the integration of terminals is getting higher, and the spacing between terminals is getting smaller. Refer to FIG. 1, if using the conventional bonding method to connect the bonding between the display device and the IC/FPC, the bonding shift will happen to cause the problem of short circuit or poor contact, and the product yield will be decreased.

SUMMARY

A technical problem to be solved by the disclosure is to provide a coupling conductive terminal structure and a display device to overcome the bonding shift in order to solve the problem of short circuit or poor contact, so the product yield could be improved To achieve the above object, according to one aspect, the embodiment of the disclosure provides a coupling conductive terminal structure, disposed between a display device and an IC or an FPC, including:
  a first linking part, disposed on the display device; and
  a second linking part, disposed on the IC or the FPC and matched with the first linking part;
  wherein the first linking part and the second linking part are locked with each other, and the display device electrically connects to the IC or the FPC.

In an embodiment, the first linking part includes a plurality of recess structure terminals, and the second linking part includes a plurality of protrusion structure terminals matched with the recess structure terminals of the first linking part.

In an embodiment, all the recess structure terminals of the first linking part are the same, and all the protrusion structure terminals of the second linking part matched with the recess structure terminals of the first linking part are the same; or
  all the recess structure terminals of the first linking part are different, and all the protrusion structure terminals of the second linking part matched with the recess structure terminals of the first linking part are different.

In an embodiment, a terminal surface of the first linking part and a terminal surface of the second linking part are respectively coated with a conductive metal, and a hardness of the conductive metal coated on the terminal surface of the first linking part is harder than a hardness of the conductive metal coated on the terminal surface of the second linking part.

In an embodiment, the conductive metal coated on the terminal surface of the first linking part includes titanium, and the conductive metal coated on the terminal surface of the second linking part includes gold.

In an embodiment, a hot-pressed adhesive fills between the recess structure terminals of the first linking part and between the protrusion structure terminals of the second linking part.

In an embodiment, the hot-pressed adhesive includes polyimide or polymethylmethacrylate.

In an embodiment, the first linking part includes a plurality of protrusion structure terminals, and the second linking part includes a plurality of recess structure terminals matched with the protrusion structure terminals of the first linking part.

According to another aspect, the embodiment of the disclosure provides a coupling conductive terminal structure, disposed between a display device and an IC or an FPC, including:
  a first linking part, disposed on the display device; and
  a second linking part, disposed on the IC or the FPC and matched with the first linking part;
  wherein the first linking part and the second linking part are locked with each other, and the display device electrically connects to the IC or the FPC;
  wherein the first linking part includes a plurality of protrusion structure terminals, and the second linking part includes a plurality of recess structure terminals matched with the protrusion structure terminals of the first linking part.

In an embodiment, all the protrusion structure terminals of the first linking part are the same, and all the recess structure terminals of the second linking part matched with the protrusion structure terminals of the first linking part are the same; or
  all the protrusion structure terminals of the first linking part are different, and all the recess structure terminals of the second linking part matched with the protrusion structure terminals of the first linking part are different.

In an embodiment, a terminal surface of the first linking part and a terminal surface of the second linking part are respectively coated with a conductive metal, and a hardness of the conductive metal coated on the terminal surface of the first linking part is harder than a hardness of the conductive metal coated on the terminal surface of the second linking part.

In an embodiment, the conductive metal coated on the terminal surface of the first linking part includes titanium, and the conductive metal coated on the terminal surface of the second linking part includes gold.

In an embodiment, a hot-pressed adhesive fills between the protrusion structure terminals of the first linking part and between the recess structure terminals of the second linking part.

In an embodiment, the hot-pressed adhesive includes polyimide or polymethylmethacrylate.

According to another aspect, the embodiment of the disclosure provides a coupling conductive terminal structure, disposed between a display device and an IC or an FPC, including:

a first linking part, disposed on the display device; and
a second linking part, disposed on the IC or the FPC and matched with the first linking part;

wherein the first linking part and the second linking part are locked with each other, and the display device electrically connects to the IC or the FPC;

wherein the first linking part includes a plurality of protrusion structure terminals, and a plurality of recess structure terminals, and the second linking part includes a plurality of protrusion structure terminals matched with the recess structure terminals of the first linking part and a plurality of recess structure terminals matched with the protrusion structure terminals of the first linking part.

In an embodiment, all the recess structure terminals of the first linking part are the same, and all the protrusion structure terminals of the second linking part matched with the recess structure terminals of the first linking part are the same; or all the protrusion structure terminals of the first linking part are the same, and all the recess structure terminals of the second linking part matched with the protrusion structure terminals of the first linking part are the same; or all the recess structure terminals of the first linking part are different, and all the protrusion structure terminals of the second linking part matched with the recess structure terminals of the first linking part are different; or all the protrusion structure terminals of the first linking part are different, and all the recess structure terminals of the second linking part matched with the protrusion structure terminals of the first linking part are different.

In an embodiment, a terminal surface of the first linking part and a terminal surface of the second linking part are respectively coated with a conductive metal, and a hardness of the conductive metal coated on the terminal surface of the first linking part is harder than a hardness of the conductive metal coated on the terminal surface of the second linking part.

In an embodiment, the conductive metal coated on the terminal surface of the first linking part includes titanium, and the conductive metal coated on the terminal surface of the second linking part includes gold.

In an embodiment, a hot-pressed adhesive fills between the recess structure terminals and the protrusion structure terminals of the first linking part and between the recess structure terminals and the protrusion structure terminals of the second linking part.

In an embodiment, the hot-pressed adhesive includes polyimide or polymethylmethacrylate.

By practice of the embodiments of the disclosure could achieve the following benefits:

1. Compare to the conventional bonding method to electrically connects the display device and the IC/FPC, the disclosure omits ACF as the conductive layer via the first linking part and the second linking part are locked with each other, and the display device electrically connects to the IC or the FPC, the bonding shift could be overcome to solve the problem of short circuit or poor contact, so the product yield could be improved.

2. The disclosure applies the recess structure terminals and the protrusion structure terminals for connection, compare to the conventional terminal structure, the connection area is larger.

3. The disclosure applies the hot-pressed adhesive filling between the terminals of the first linking part and between the terminals of the second linking part to connect the bonding between the display device and the IC/FPC to overcome the bonding shift.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
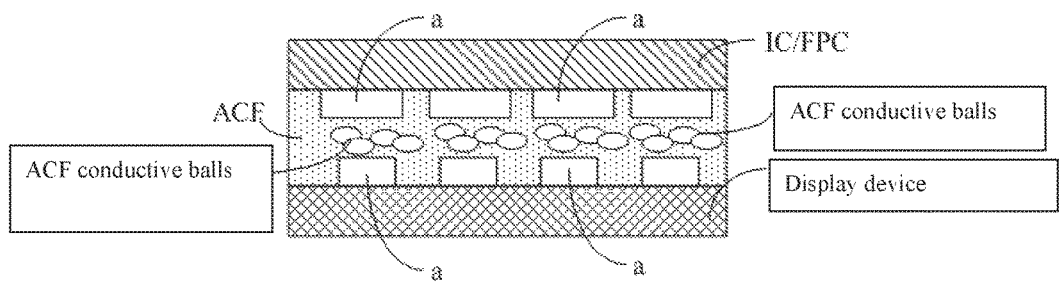
FIG. 1 is a structural schematic view of bonding connection of the prior art.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Figure 2:
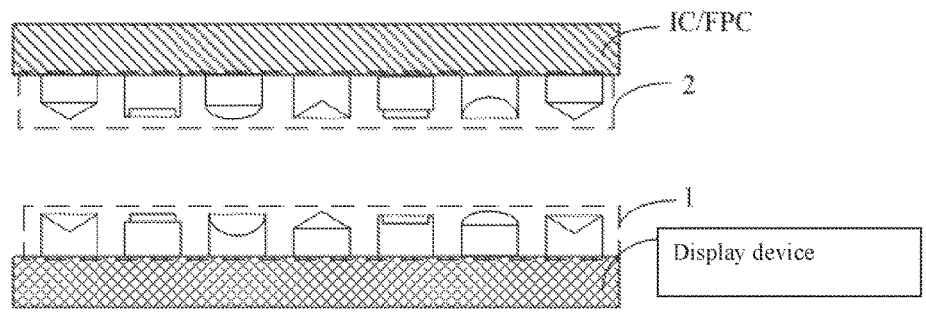
FIG. 2 is a structural schematic view of a coupling conductive terminal structure before bonding connection according to Embodiment 1 of the disclosure.
Figure 3:
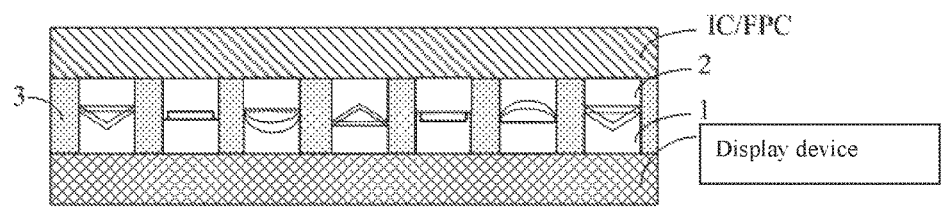
FIG. 3 is a structural schematic view of a coupling conductive terminal structure after bonding connection according to Embodiment 1 of the disclosure.

Referring to FIG. 2 and FIG. 3, a coupling conductive terminal structure provided by Embodiment 1 is disposed between a display device and an IC or an FPC and includes a first linking part 1 disposed on the display device, and a second linking part 2 disposed on the IC or the FPC and matched with the first linking part 1, wherein the first linking part 1 and the second linking part 2 are locked with each other, and the display device electrically connects to the IC or the FPC.

It should be noted that due to the first linking part 1 and the second linking part 2 are locked with each other, the connection area is larger when the display device electrically connects to the IC or the FPC, and the bonding shift could be overcome to solve the problem of short circuit or poor contact, so the product yield could be improved.

In Embodiment 1, the first linking part 1 and the second linking part 2 includes a plurality of terminals to increase the connection area as the following situations:

(1) The first linking part 1 includes a plurality of recess structure terminals, and the second linking part 2 includes a plurality of protrusion structure terminals matched with the recess structure terminals of the first linking part 1;

(2) The first linking part 1 includes a plurality of protrusion structure terminals, and the second linking part 2 includes a plurality of recess structure terminals matched with the protrusion structure terminals of the first linking part 1;

(3) The first linking part 1 includes a plurality of protrusion structure terminals, and a plurality of recess structure terminals, and the second linking part 2 includes a plurality of protrusion structure terminals matched with the recess structure terminals of the first linking part 1 and a plurality of recess structure terminals matched with the protrusion structure terminals of the first linking part 1.

It should be noted that the recess surface of the recess structure terminal could be a conical surface, curved surface, recess surface, or other.

In Embodiment 1, the increase of the terminal area could be conducted according to the following way:

the plane length (L), width (W) and depth of depression (H) of a certain terminal have been determined, and the inclination angle of the bevel is assumed to be θ, the increase amount of the terminal area compared to the conventional terminal is: $\Delta S=2WL(1/\cos \theta -1)$. Therefore, the terminal area could be increased via increasing the inclination angle θ.

In Embodiment 1, the terminals of the first linking part 1 and the second linking part 2 could be the same or different.

In one embodiment, all the recess structure terminals of the first linking part 1 are the same, and all the protrusion structure terminals of the second linking part 2 matched with the recess structure terminals of the first linking part 1 are the same. In another embodiment, all the protrusion structure terminals of the first linking part 1 are the same, and all the recess structure terminals of the second linking part 2 matched with the protrusion structure terminals of the first linking part 1 are the same. In another embodiment, all the recess structure terminals of the first linking part 1 are different, and all the protrusion structure terminals of the second linking part 2 matched with the recess structure terminals of the first linking part 1 are different. In another embodiment, all the protrusion structure terminals of the first linking part 1 are different, and all the recess structure terminals of the second linking part 2 matched with the protrusion structure terminals of the first linking part 1 are different.

In Embodiment 1, a terminal surface of the first linking part 1 and a terminal surface of the second linking part 2 are respectively coated with a conductive metal, so the conductivity between the display device and the IC/FPC. A hardness of the conductive metal coated on the terminal surface of the first linking part is harder than a hardness of the conductive metal coated on the terminal surface of the second linking part, so the terminals of the display device could penetrate the IC/FPC to increase the reliability of the terminals locking with each other. In one embodiment, the conductive metal coated on the terminal surface of the first linking part includes titanium, and the conductive metal coated on the terminal surface of the second linking part includes gold, wherein the hardness of titanium is harder than the hardness of gold.

In Embodiment 1, a hot-pressed adhesive 3 fills between the recess structure terminals and the protrusion structure terminals of the first linking part 1 and between the recess structure terminals and the protrusion structure terminals of the second linking part 2. In this way, the bonding connection between the display device and the IC/FPC via the hot-pressed adhesive 3, so the bonding shift could be overcome. In one embodiment, the hot-pressed adhesive 3 includes polyimide or polymethylmethacrylate (i.e. acrylic).

Corresponding to the coupling conductive terminal structure of Embodiment 1, Embodiment 2 further provides a display device. The display device includes the coupling conductive terminal structure of Embodiment 1. Due to the coupling conductive terminal structure in the Embodiment 2 has the same structure and the same connection, so the details are not addressed herein.

In summary, the coupling conductive terminal structure and the display device provided by the embodiments of the disclosure compares to the conventional bonding method to electrically connects the display device and the IC/FPC, the disclosure omits ACF as the conductive layer via the first linking part and the second linking part are locked with each other, and the display device electrically connects to the IC or the FPC, the bonding shift could be overcome to solve the problem of short circuit or poor contact, so the product yield could be improved. The disclosure applies the recess structure terminals and the protrusion structure terminals for connection, compare to the conventional terminal structure, the connection area is larger. The disclosure applies the hot-pressed adhesive filling between the terminals of the first linking part and between the terminals of the second linking part to connect the bonding between the display device and the IC/FPC to overcome the bonding shift.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A coupling conductive terminal structure, disposed between a display device and an IC or an FPC, comprising:
   a first linking part, disposed on the display device and having a plurality of recess structure terminals; and
   a second linking part, disposed on the IC or the FPC and having a plurality of protrusion structure terminals matched with the recess structure terminals of the first linking part;
   wherein the first linking part and the second linking part are locked with each other, and the display device electrically connects to the IC or the FPC;
   wherein a terminal surface of the first linking part is coated with a conductive titanium, a terminal surface of the second linking part is coated with a conductive gold, and a hardness of the conductive titanium is harder than a hardness of the conductive gold.

2. The coupling conductive terminal structure according to claim 1, wherein all the recess structure terminals of the first linking part are the same, and all the protrusion structure terminals of the second linking part matched with the recess structure terminals of the first linking part are the same; or
   all the recess structure terminals of the first linking part are different, and all the protrusion structure terminals of the second linking part matched with the recess structure terminals of the first linking part are different.

3. The coupling conductive terminal structure according to claim 2, wherein a hot-pressed adhesive fills between the recess structure terminals of the first linking part and between the protrusion structure terminals of the second linking part.

4. The coupling conductive terminal structure according to claim 3 wherein the hot-pressed adhesive includes polyimide or polymethylmethacrylate.

5. A coupling conductive terminal structure, disposed between a display device and an IC or an FPC, comprising:
   a first linking part, disposed on the display device; and
   a second linking part, disposed on the IC or the FPC and matched with the first linking part;
   wherein the first linking part and the second linking part are locked with each other, and the display device electrically connects to the IC or the FPC;
   wherein the first linking part includes a plurality of protrusion structure terminals, and the second linking part includes a plurality of recess structure terminals matched with the protrusion structure terminals of the first linking part; and
   wherein a terminal surface of the first linking part is coated with a conductive titanium, a terminal surface of the second linking part is coated with a conductive gold, and a hardness of the conductive titanium is harder than a hardness of the conductive gold.

6. The coupling conductive terminal structure according to claim 5, wherein all the protrusion structure terminals of the first linking part are the same, and all the recess structure terminals of the second linking part matched with the protrusion structure terminals of the first linking part are the same; or
   all the protrusion structure terminals of the first linking part are different, and all the recess structure terminals of the second linking part matched with the protrusion structure terminals of the first linking part are different.

7. The coupling conductive terminal structure according to claim 6, wherein a hot-pressed adhesive fills between the protrusion structure terminals of the first linking part and between the recess structure terminals of the second linking part.

8. The coupling conductive terminal structure according to claim 7 wherein the hot-pressed adhesive includes polyimide or polymethylmethacrylate.

9. A coupling conductive terminal structure, disposed between a display device and an IC or an FPC, comprising:
   a first linking part, disposed on the display device; and
   a second linking part, disposed on the IC or the FPC and matched with the first linking part;
   wherein the first linking part and the second linking part are locked with each other, and the display device electrically connects to the IC or the FPC;
   wherein the first linking part includes a plurality of protrusion structure terminals, and a plurality of recess structure terminals, and the second linking part includes a plurality of protrusion structure terminals matched with the recess structure terminals of the first linking part and a plurality of recess structure terminals matched with the protrusion structure terminals of the first linking part; and
   wherein a terminal surface of the first linking part is coated with a conductive titanium, a terminal surface of the second linking part is coated with a conductive gold, and a hardness of the conductive titanium is harder than a hardness of the conductive gold.

10. The coupling conductive terminal structure according to claim 9, wherein all the recess structure terminals of the first linking part are the same, and all the protrusion structure terminals of the second linking part matched with the recess structure terminals of the first linking part are the same; or
    all the protrusion structure terminals of the first linking part are the same, and all the recess structure terminals of the second linking part matched with the protrusion structure terminals of the first linking part are the same; or
    all the recess structure terminals of the first linking part are different, and all the protrusion structure terminals of the second linking part matched with the recess structure terminals of the first linking part are different; or
    all the protrusion structure terminals of the first linking part are different, and all the recess structure terminals of the second linking part matched with the protrusion structure terminals of the first linking part are different.

11. The coupling conductive terminal structure according to claim 10, wherein a hot-pressed adhesive fills between the recess structure terminals and the protrusion structure terminals of the first linking part and between the recess structure terminals and the protrusion structure terminals of the second linking part.

12. The coupling conductive terminal structure according to claim 11 wherein the hot-pressed adhesive includes polyimide or polymethylmethacrylate.

* * * * *